(12) United States Patent
Hayakawa et al.

(10) Patent No.: US 10,438,993 B2
(45) Date of Patent: Oct. 8, 2019

(54) LIGHT EMITTING ELEMENT ARRAY AND OPTICAL TRANSMISSION DEVICE

(71) Applicant: FUJI XEROX CO., LTD., Tokyo (JP)

(72) Inventors: Junichiro Hayakawa, Kanagawa (JP);
Akemi Murakami, Kanagawa (JP);
Hideo Nakayama, Kanagawa (JP);
Tsutomu Otsuka, Kanagawa (JP)

(73) Assignee: FUJI XEROX CO., LTD., Minato-Ku, Tokyo (JP)

( * ) Notice: Subject to any disclaimer, the term of this patent is extended or adjusted under 35 U.S.C. 154(b) by 0 days.

(21) Appl. No.: 15/790,623

(22) Filed: Oct. 23, 2017

(65) Prior Publication Data
US 2018/0138236 A1 May 17, 2018

(30) Foreign Application Priority Data
Nov. 16, 2016 (JP) .................. 2016-223546

(51) Int. Cl.
*H01L 27/15* (2006.01)
*F21V 8/00* (2006.01)
*G02B 6/02* (2006.01)
*H01L 33/10* (2010.01)
(Continued)

(52) U.S. Cl.
CPC .......... *H01L 27/156* (2013.01); *G02B 6/0073* (2013.01); *G02B 6/02076* (2013.01); *H01L 33/10* (2013.01); *H01L 33/14* (2013.01); *G02B 6/4202* (2013.01)

(58) Field of Classification Search
CPC .................... G02B 6/80068; G02B 6/0073; G02B 6/4249; G02B 6/43; H04B 10/803

USPC .......... 398/157, 164, 60; 362/158, 184, 227, 362/231, 246, 248
See application file for complete search history.

(56) References Cited

U.S. PATENT DOCUMENTS 6,007,209 A * 12/1999 Pelka .................... G01D 11/28
362/23.08
2005/0169336 A1 8/2005 Ishii et al.
(Continued)

FOREIGN PATENT DOCUMENTS

JP 2005-252240 A 9/2005

OTHER PUBLICATIONS

Szweda ["VCSELs part 2: The vertical challenge", The Advanced Semiconductor Magazine vol. 4, May 2001] (Year: 2001).*
(Continued)

*Primary Examiner* — Oommen Jacob
(74) *Attorney, Agent, or Firm* — Sughrue Mion, PLLC

(57) ABSTRACT

A light emitting element array includes plural light emitting elements connected in parallel to each other by a wiring connected to a terminal that supplies a current. Each of the light emitting elements is disposed at a position of a predetermined path length along a path of the current flowing from the terminal through the wiring. The plural light emitting elements include, in a mixed form, one or more first light emitting elements each having a non-shielded light emission aperture and one or more second light emitting elements each having a shielded light emission aperture. At least one of the first light emitting elements is disposed at a position of the longest path length. At least one of the second light emitting elements is disposed at a position of the shortest path length.

10 Claims, 8 Drawing Sheets

(51) Int. Cl.
*H01L 33/14* (2010.01)
*G02B 6/42* (2006.01)

(56) References Cited

U.S. PATENT DOCUMENTS

| | | | | |
|---|---|---|---|---|
| 2005/0180700 A1* | 8/2005 | Farr | ............... | G02B 6/4246 385/89 |
| 2006/0291203 A1* | 12/2006 | Anandan | ............... | G02B 6/0043 362/231 |
| 2009/0266989 A1* | 10/2009 | Schwarz | ............... | B23K 9/0956 250/358.1 |
| 2011/0248835 A1* | 10/2011 | Speegle | ............... | G08C 19/02 340/12.32 |
| 2012/0069560 A1* | 3/2012 | Miskin | ............... | H05B 33/0806 362/227 |
| 2015/0069113 A1* | 3/2015 | Wang | ............... | H01S 5/02272 228/102 |

OTHER PUBLICATIONS

University of Rochester [Laser Doubles Efficiency of Traditional Lightbulbs, May 2009], (Year: 2009).*

Haitz [Another Semiconductor Revolution: This Time It's Lighting!, Optoelectronics Industry development Association, Dec. 1999] (Year: 1999).*

Communication dated Mar. 27, 2018, from Japanese Patent Office in counterpart application No. 2016-223546.

* cited by examiner (0V)

(150V)

(200V)

(250V)

○ LIGHT EMITTING UNIT 50
⊘ SHIELDED LIGHT EMITTING UNIT 50B

LIGHT EMITTING ELEMENT ARRAY AND OPTICAL TRANSMISSION DEVICE

CROSS-REFERENCE TO RELATED APPLICATIONS

This application is based on and claims priority under 35 USC 119 from Japanese Patent Application No. 2016-223546 filed Nov. 16, 2016.

BACKGROUND

Technical Field

The present invention relates to a light emitting element array and an optical transmission device.

SUMMARY

According to an aspect of the invention, a light emitting element array includes plural light emitting elements connected in parallel to each other by a wiring connected to a terminal that supplies a current. Each of the light emitting elements is disposed at a position of a predetermined path length along a path of the current flowing from the terminal through the wiring. The plural light emitting elements include, in a mixed form, one or more first light emitting elements each having a non-shielded light emission aperture and one or more second light emitting elements each having a shielded light emission aperture. At least one of the first light emitting elements is disposed at a position of the longest path length. At least one of the second light emitting elements is disposed at a position of the shortest path length.

BRIEF DESCRIPTION OF THE DRAWINGS

Exemplary embodiments of the present invention will be described in detail based on the following figures, wherein.

DETAILED DESCRIPTION

Hereinafter, exemplary embodiments for carrying out the present invention will be described in detail with reference to the drawings.

First Exemplary Embodiment

Figure 1A:
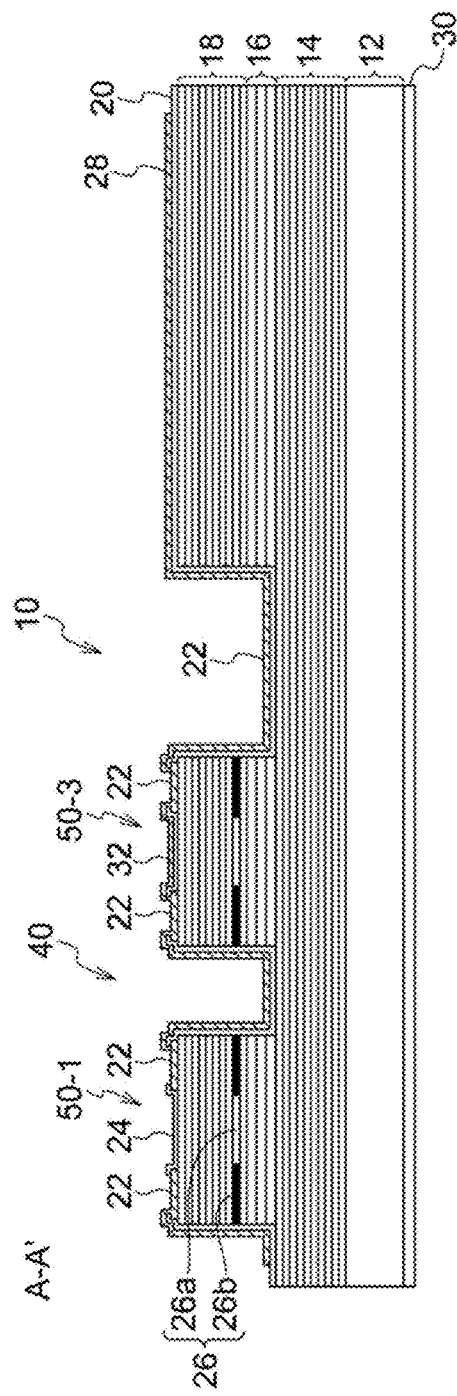
FIG. 1A is a cross-sectional view illustrating an example of the configuration of a light emitting element array according to a first exemplary embodiment.
Figure 1B:
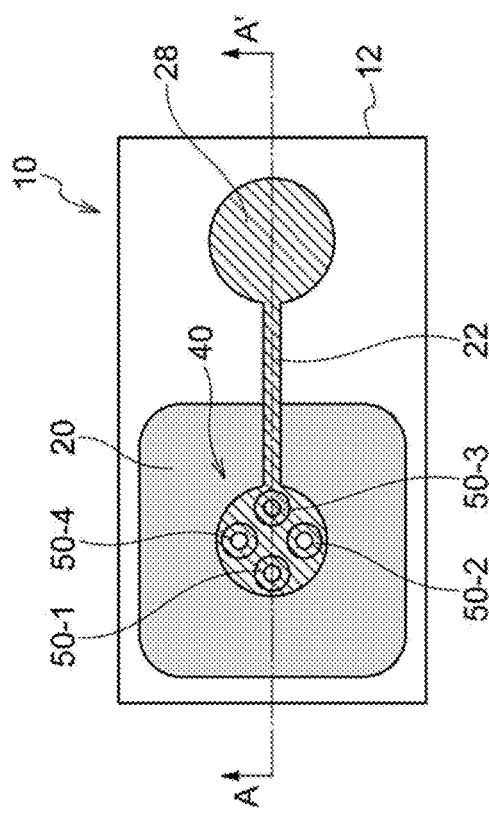
FIG. 1B is a plan view of the light emitting element array.

An example of the configuration of a light emitting element array 10 according to the present exemplary embodiment will be described with reference to FIGS. 1A and 1B. An example in which a vertical cavity surface emitting laser (VCSEL) array is applied to a light emitting element array according to the present exemplary embodiment will be described below. FIG. 1A is a cross-sectional view of the light emitting element array 10 according to the present exemplary embodiment. FIG. 1B is a plan view of the light emitting element array 10. The cross-sectional view illustrated in FIG. 1A is a cross-sectional view taken along the line A-A' in the plan view illustrated in FIG. 1B. As one example, the light emitting element array 10 is used in an optical transmitter of an optical transmission device. Light emitted from the light emitting element array 10 is coupled to an optical transmission path of an optical fiber or the like. In the present exemplary embodiment, plural VCSELs are mainly used in order to secure the redundancy of light emission from the optical transmitter. That is, each of the light emitting elements constituting the light emitting element array according to the exemplary embodiment has a rating capable of outputting the amount of light required to perform communication as a single light emitting element, and the light emitting element array is configured with the plural light emitting elements connected in parallel to each other so that even if one of the light emitting elements is damaged, normal communication is still maintained. With this configuration, redundancy is secured. It should be noted that it is not always necessary for each light emitting element to be capable of emitting the amount of light required to perform communication as a single light emitting element.

As illustrated in FIG. 1A, the light emitting element array 10 is formed into a stacked structure. The stacked structure includes an n-side electrode wiring 30, an n-type lower distributed Bragg reflector (DBR) 14 formed on an n-type gallium arsenide (GaAs) substrate 12, an active layer area 16, an oxide confinement layer 26, a p-type upper DBR 18, an interlayer insulating film 20, and a p-side electrode wiring 22.

As illustrated in FIG. 1B, the light emitting element array 10 includes a light emitting area 40 and a p-side electrode pad 28.

The light emitting area 40 is an area configured as a VCSEL array including multiple light emitting units. In the present exemplary embodiment, for example, four light emitting units 50-1, 50-2, 50-3, and 50-4 (which may be collectively referred to as a "light emitting unit 50" below) formed in mesa shapes are provided. The area of each light emitting unit excluding an emission aperture is covered with the p-side electrode wiring 22, so that the respective light emitting units are electrically connected in parallel to each other. It should be noted that in the light emitting element array 10 according to the present exemplary embodiment, a light emission aperture of at least one of the multiple light emitting units 50 is shielded by the p-side electrode wiring 22 so that no light is emitted through the light emission aperture. In the light emitting element array 10, an emission aperture of the light emitting unit 50-3 is shielded, whereas emission apertures of the light emitting units 50-1, 50-2 and 50-4 are not shielded. In other words, when power is supplied to the light emitting element array 10, light is emitted substantially simultaneously from the light emitting units 50-1, 50-2 and 50-4, except for the light emitting unit 50-3. Hereinafter, a mesa which has a shielded light emission aperture will also be referred to as the "light emitting unit 50", for convenience.

The p-side electrode pad 28 is a pad that is configured as a portion of the p-side electrode wiring 22. The p-side electrode pad 28 is a pad to which a positive electrode of a power supply is connected when the power supply for supplying a current to the light emitting area 40 via the p-side electrode wiring 22 is connected. In addition, a negative electrode of the power supply is connected to the n-side electrode wiring 30 which is formed on the back surface of the substrate 12.

Assuming that the oscillation wavelength of the light emitting element array 10 is λ and the refractive index of a medium (semiconductor layer) is n, the n-type lower DBR 14 formed on the substrate 12 is a multilayered-film reflector formed by alternately and repeatedly stacking two semiconductor layers which have a film thickness of 0.25λ/n and have different refractive indices.

The active layer area 16 formed on the lower DBR 14 is an area that generates light to be emitted from a light emitting unit 50. The active layer area 16 includes a lower spacer 114, a quantum well active layer 116, and an upper spacer 118 which are formed in this order on the lower DBR 14 (see FIGS. 5A to 5F).

The quantum well active layer 116 according to the present exemplary embodiment may be configured with, for example, barrier layers of four GaAs layers and quantum well layers of three InGaAs layers each provided between the adjacent GaAs layers. In addition, the lower spacer 114 and the upper spacer 118 are respectively disposed between the quantum well active layer 116 and the lower DBR 14 and between the quantum well active layer 116 and the upper DBR 18. With this configuration, the lower spacer 114 and the upper spacer 118 have a function of adjusting the length of a resonator and serve as clad layers for confining carriers.

The p-type oxide confinement layer 26, provided on the active layer area 16, is a current confinement layer. The p-type oxide confinement layer 26 includes a non-oxidized area 26a and an oxidized area 26b. The current flowing from the p-side electrode pad 28 toward the n-side electrode wiring 30 is narrowed (confined) by the non-oxidized area 26a.

The upper DBR 18, formed on the oxide confinement layer 26, is a multilayered-film reflector formed by alternately and repeatedly stacking two semiconductor layers which have a film thickness of 0.25λ/n and have different refractive indices.

An emission surface protection layer 24 is formed on the upper DBR 18 of the light emitting units 50-1, 50-2 and 50-4, to protect a light emission surface. The emission surface protection layer 24 is formed, for example, by depositing a silicon nitride film. On the other hand, the upper DBR 18 of the light emitting unit 50-3 is covered with the p-side electrode wiring 22. A portion of the light emitting unit 50-3 that corresponds to the emission surface protection layer 24 of the light emitting units 50-1, 50-2 and 50-4 is a shield portion 32 formed of a metal film. That is, the light emission aperture of the light emitting unit 50-3 is shielded from light.

As illustrated in FIGS. 1A and 1B, the interlayer insulating film 20 as an inorganic insulating film is deposited around a semiconductor layer including the mesa of the light emitting unit 50. The interlayer insulating film 20 is disposed below the p-side electrode wiring 22 and the p-side electrode pad 28. The interlayer insulating film 20 according to the present exemplary embodiment is formed of, for example, a silicon nitride film (SiN film). It should be noted that the material of the interlayer insulating film 20 is not limited to the silicon nitride film. The material of the interlayer insulating film 20 may be, for example, a silicon oxide film ($SiO_2$ film) or a silicon oxynitride film (SiON film).

As illustrated in FIG. 1A, in the light emitting unit 50-1, the p-side electrode wiring 22 is connected to the upper DBR 18 through an opening in the interlayer insulating film 20 (the same applies to the light emitting units 50-2 and 50-4). A contact layer 124 (see FIGS. 5A to 5F) for connection with the p-side electrode wiring 22 is provided in the uppermost layer of the upper DBR 18. One end side of the p-side electrode wiring 22 is connected to the upper DBR 18 via the contact layer 124 and forms an ohmic contact with the upper DBR 18.

Meanwhile, the VCSEL which constitute the light emitting unit 50 (the light emitting units 50-1, 50-2 and 50-4) of the light emitting element array 10 extracts a laser output in a direction perpendicular to the substrate and further facilitates array formation by two-dimensional integration. Thus, VCSELs are suitably used, for example, as a light source for optical communication.

The VCSEL includes a pair of distributed Bragg reflectors (the lower DBR 14 and the upper DBR 18) provided on a semiconductor substrate (the substrate 12) and an active layer area (the active layer area 16) formed between the pair of distributed Bragg reflectors. The optical module is configured such that current is injected into the active layer area by electrodes (the p-side electrode wiring 22 and the n-side electrode wiring 30) provided on the opposite sides of the distributed Bragg reflectors, laser oscillation is generated perpendicularly to the substrate surface, and oscillated light is emitted from the top of an element (the surface side of the emission surface protection layer 24).

In addition, an oxide confinement layer (the oxide confinement layer 26) which is formed by oxidizing a semiconductor layer containing Al in the composition thereof is provided in terms of, for example, low threshold current and controllability of a transverse mode. In order to oxidize the semiconductor layer containing Al, the element is etched into a mesa shape and is subjected to an oxidation treatment. Thereafter, the mesa-shaped side surface exposed by the etching processing and the etched semiconductor surface are generally covered with an insulating material such as a silicon nitride film or a silicon oxide film.

Here, not only the light emitting element array 10 according to the present exemplary embodiment but also semiconductor elements might be damaged by electrostatic discharge (ESD). That is, discharge current flows into the semiconductor element due to a surge applied from the outside or the like, which might damage the semiconductor element by local heat generation and electric field concentration. A surge caused by ESD generally reaches an internal circuit of a semiconductor element through an input/output terminal (input/output pad) or a power supply terminal (power supply pad) of the semiconductor element, which might damage the internal circuit.

Therefore, how much resistance a manufactured semiconductor element has against a surge due to ESD may be known in advance. As a test for this, an ESD withstand voltage test is known. The ESD withstand voltage test applies a high voltage pulse which simulates a surge due to ESD to a semiconductor element via a terminal (pad) to know the damaged state of the semiconductor element or the like. In the present exemplary embodiment, "surge" means at least one of surge current or surge voltage. In addition, "damage (damaged)" includes a state where a light emitting element does not completely emit light and a state where the performance of a light emitting element is deteriorated due to a surge, such as a reduction in the amount of light.

The inventors carried out the ESD withstand voltage test for light emitting element arrays and inspected the state of individual light emitting units in the light emitting element arrays. The inspection results reveals that the degree of damage due to ESD depends on the path length on a wiring from a terminal to each of the plural light emitting units along the path of current.

Figure 2:
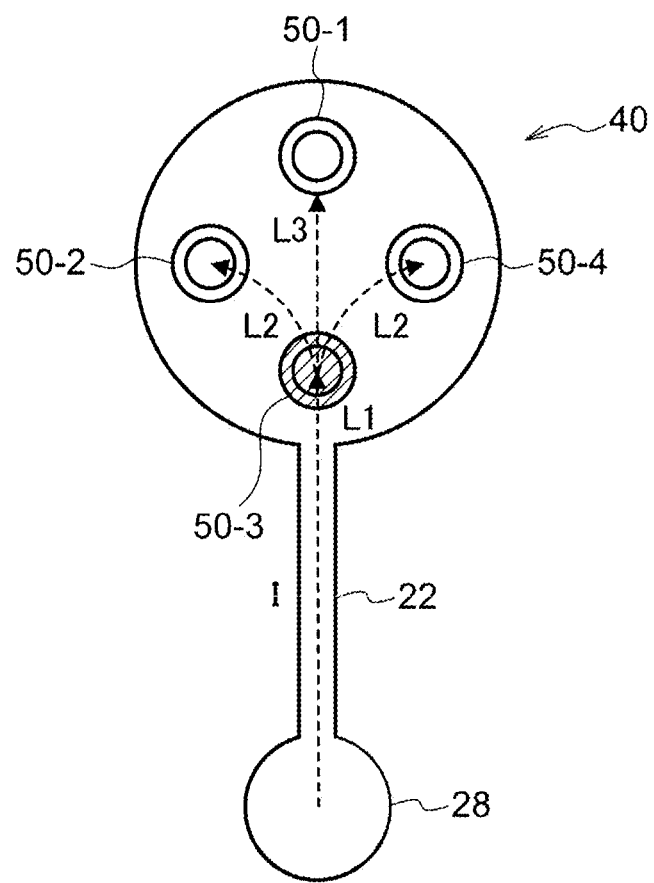
FIG. 2 is an explanatory view of a path length from a pad of a light emitting unit in a light emitting area according to the first exemplary embodiment.

A path length from a terminal to a light emitting unit 50 will be described with reference to FIG. 2. FIG. 2 is a view illustrating the light emitting area including light emitting units 50-1, 50-2, 50-3 and 50-4, the p-side electrode pad 28, and the p-side electrode wiring 22, which are extracted from the light emitting element array 10 illustrated in FIGS. 1A and 1B. In the present exemplary embodiment, the light emitting units 50-1, 50-2, 50-3 and 50-4 are electrically connected in parallel. In FIG. 2, a current I flows from the p-side electrode pad 28 to the light emitting area 40. Apart of the current I is supplied to each of the light emitting units 50-1, 50-2, 50-3 and 50-4. In this case, the path of the current from the p-side electrode pad 28 to the light emitting unit 50-3 through the p-side electrode wiring 22 is defined as a path length L1. From this definition, the path length for the light emitting unit 50-2 is defined as L2, the path length for the light emitting unit 50-4 is defined as L2, and the path length for the light emitting unit 50-1 is defined as L3. In the example illustrated in FIG. 2, the light emitting units 50-2 and 50-4 are equidistant from the p-side electrode pad 28. In the example illustrated in FIG. 2, a magnitude relationship between the path lengths L1, L2 and L3 is set to be L1<L2<L3. That is, the path length L1 of the light emitting unit 50-3 is the shortest path length, and the path length L3 of the light emitting unit 50-1 is the longest path length. In the light emitting element array according to the present exemplary embodiment, as illustrated in FIG. 2, the light emitting unit 50-3 disposed at the shortest path length is shielded.

The ESD withstand voltage test for light emitting element arrays carried out by the inventors reveals that even if plural light emitting units 50 are disposed to have small spacing therebetween, such as about 50 μm, stress is not equally applied to all the light emitting units 50, and a light emitting unit 50 having a shorter path length, that is, the light emitting unit 50 which is disposed more upstream on the path of the driving current is more easily damaged. Meanwhile, as will be described later, the results also reveals that the wavelength spectrum of the optical output varies when the light emitting unit 50 is damaged by ESD or the like. That is, unless any measure is taken based on a position on the path of current from a power supply in the light emitting element array, there is a possibility that the wavelength spectrum of the optical output varies due to ESD or the like, thereby deteriorating the transmission quality of a transmission device using the light emitting element array.

More specifically, in the light emitting element array, when a surge voltage such as ESD is applied, the respective light emitting units deteriorate to different degrees depending on the intensity of stress applied to the respective light emitting units. In addition, the greater the deterioration of the light emitting unit, the greater the amount of variation in emitted wavelength compared to that before deterioration. That is, when a surge voltage such as ESD is applied, the wavelength spectrum in each light emitting unit varies from the initial state. As a result, the uniformity of wavelength spectra among the multiple light emitting units is deteriorated, which has a possibility of adversely affecting the signal quality of optical transmission compared to before deterioration. In particular, the following limitation may be imposed on an optical transmission device which will be described later. The standard core diameter of a multi-mode fiber is as small as 100 μm or less (50 μm or 62.5 μm) or about 100 μm or less. Thus, when a multi-mode fiber is used as, for example, an optical transmission path for communication, the number of light emitting units 50 may often be limited to, for example, 5 or less (about 2 to 5) in order to cause light from the plural light emitting units 50 connected in parallel to enter the core of the multi-mode fiber. Therefore, in such an optical transmission device, variation in wavelength spectrum in one light emitting unit 50 has a great effect on variation in the wavelength spectrum in the entire light emitting element array.

In the exemplary embodiment of the present invention, at least one emission aperture of the light emitting unit 50 disposed at the position of the shortest path length (hereinafter may be referred to as a "shortest light emitting unit 50S") is shielded, and at least one emission aperture of the light emitting unit 50 disposed at the position of the longest path length (hereinafter may be referred to as a "longest light emitting unit 50L") is not shielded. That is, the shortest light emitting unit 50S, which is the most easily damaged by ESD or the like, is configured so as not to output light. Therefore, even if the shortest light emitting unit 50S is damaged due to application of ESD or the like thereto, variation in the wavelength spectrum of the total optical output from the light emitting element array is reduced, compared to a case where the shortest light emitting unit 50S is not shielded. In addition, the longest light emitting unit 50L, which is the most difficult to be damaged by ESD or the like, is not shielded. Therefore, compared to a case in which the longest light emitting unit 50L is shielded and the shortest light emitting unit 50S is not shielded, variation in the wavelength spectrum of the total optical output from the light emitting element array when ESD or the like is applied is reduced. In addition, in particular, if a multi-mode fiber is used as an optical transmission path, variation in the wavelength spectrum of the entire light emitting element array is effectively reduced. In addition, it may be determined whether to shield light emitting units other than the shortest light emitting unit 50S and the longest light emitting unit 50L, based on the optical output power or the like which is required for a device (such as an optical transmission device) to which the light emitting device array is applied.

Next, the results of the ESD damage test performed for a light emitting element array according to a comparative example will be described with reference to FIGS. 3A to 3E and FIGS. 4A to 4E. The light emitting element array according to the comparative example used in this test includes a light emitting area 90 according to the comparative example illustrated in FIG. 3E. That is, the light emitting area 90 includes light emitting units 50-1, 50-2, 50-3 and 50-4 having the same structure. A p-side electrode wiring 22 extends from the light emitting area 90 to a lower part of the sheet of the figure and is connected to a p-side electrode pad 28 (not illustrated). The path length of the light emitting unit 50-1 is equal to the path length of the light emitting unit 50-2. The path length of the light emitting unit 50-3 is equal to the path length of the light emitting unit 50-4. The path lengths of the light emitting units 50-1 and 50-2 are shorter than those of the light emitting units 50-3 and 50-4. In other words, two shortest light emitting units 50S (50-1 and 50-2) are provided in the light emitting area 90. In addition, the distance between the centers of the respective light emitting units is set to about 50 μm. The distance from the center position of the p-side electrode pad 28 (not illustrated) to the position of center of gravity of the plural light emitting units 50-1 to 50-4 (the center position of the light emitting area 90) is set to about 160 μm.

Figure 3A:
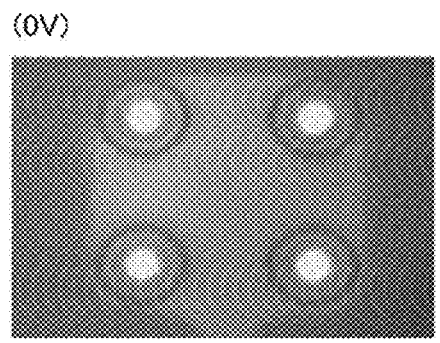
FIGS. 3A to 3D are images of light emitting units illustrating the results of an ESD withstand voltage test of a light emitting element array according to a comparative example.
Figure 3B:
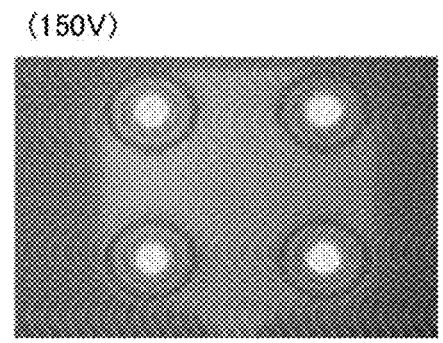
Figure 3C:
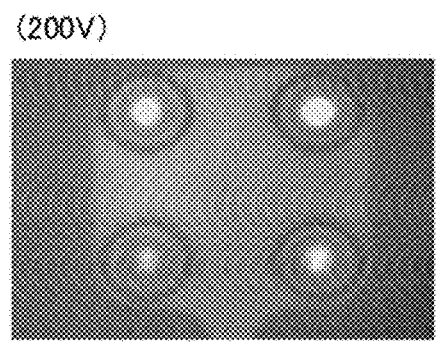
Figure 3D:
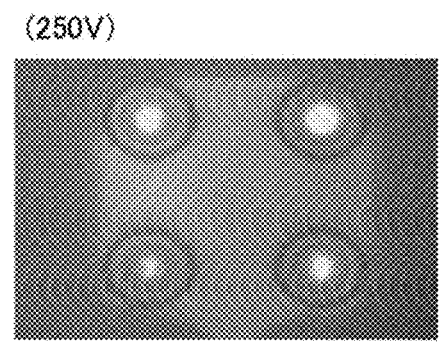
Figure 3E:
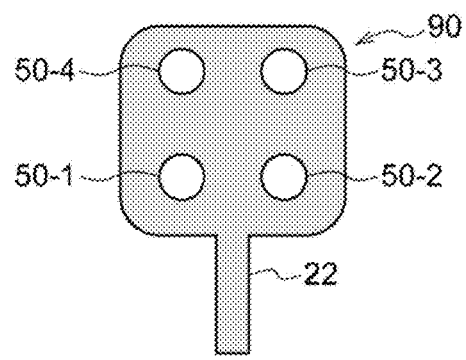
FIG. 3E is a plan view illustrating the arrangement of the respective light emitting units of the light emitting element array according to the comparative example.

FIGS. 3A to 3D illustrate the light emitting state of the light emitting area 90 after the voltage of the ESD test is applied to the light emitting element array according to the comparative example via the p-side electrode pad 28. The arrangement of the light emitting units 50 in FIGS. 3A to 3D is the same as that in FIG. 3E. FIG. 3A illustrates the light emitting state when the applied voltage is 0V (that is, the initial state). FIG. 3B illustrates the light emitting state when the applied voltage is 150V. FIG. 3C illustrates the light emitting state when the applied voltage is 200V. FIG. 3D illustrates the light emitting state when the applied voltage is 250V.

As illustrated in FIG. 3B, there is almost no change in the light emitting state of the light emitting unit 50 when the applied voltage is 150V. As illustrated in FIGS. 3C and 3D, when the applied voltages are 200V and 250V, the amount of light of the light emitting units 50-1 and 50-2 is reduced. From these results, it can be seen that a light emitting unit 50 having a shorter path length is more easily damaged and that if plural light emitting units 50 have the shortest path length, they are easily damaged simultaneously.

Figure 4A:
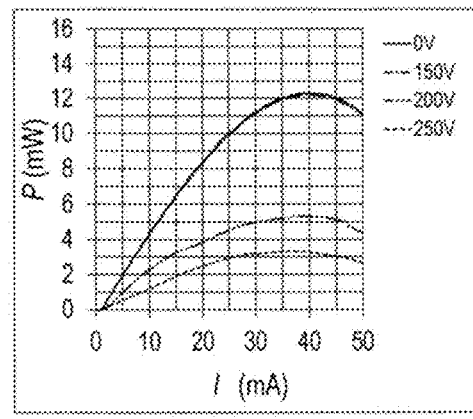
FIG. 4A is a graph illustrating optical output characteristics of the result of the ESD withstand voltage test of the light emitting element arrays according to comparative examples.
Figure 4B:
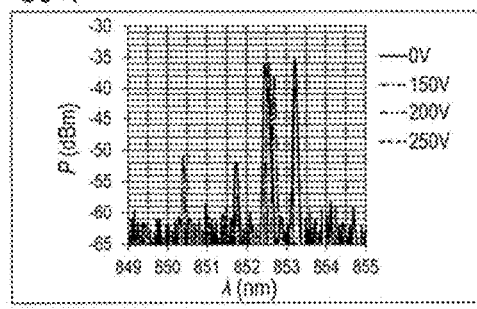
FIGS. 4B to 4E are graphs each illustrating spectrum characteristics.
Figure 4C:
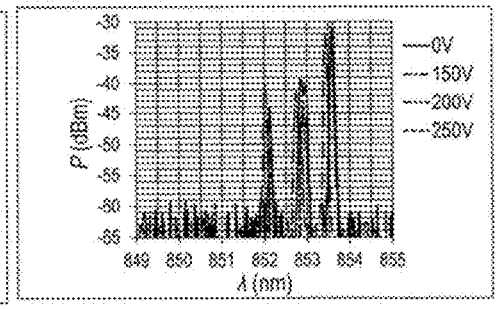
Figure 4D:
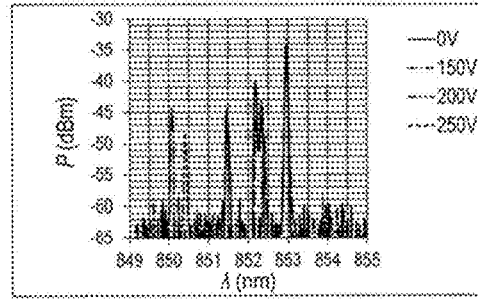
Figure 4E:
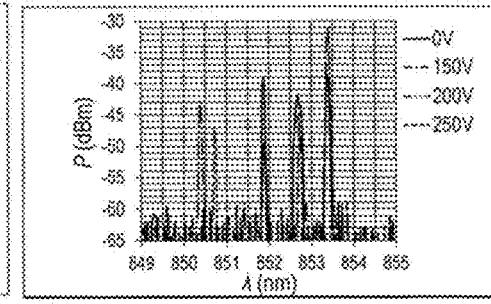

FIGS. 4A to 4E illustrate the results obtained by inspecting the optical output characteristics of light emitting element arrays according to four comparative examples after the voltages are applied. FIG. 4A illustrates the inspection result of optical outputs P. FIG. 4B illustrates the inspection result of the spectrum of output light of the light emitting unit 50-4. FIG. 4C illustrates the inspection result of the spectrum of output light of the light emitting unit 50-3. FIG. 4D illustrates the inspection result of the spectrum of output light of the light emitting unit 50-1. FIG. 4E illustrates the inspection result of the spectrum of output light of the light emitting unit 50-2.

It can be seen from FIG. 4A that although there is almost no change from the initial state when the applied voltage is 150V (in FIG. 4A, curves for the applied voltages of 0V and 150V overlap each other), the characteristics of the optical output P with respect to the current I deteriorate when the applied voltage is increased to 200V and 250V.

It can be seen from FIGS. 4B and 4C that the light emitting units 50-4 and 50-3 have substantially no change in spectrum even if the applied voltage is increased. On the other hand, it can be seen from FIGS. 4D and 4E that the wavelengths of the light from the light emitting units 50-1 and 50-2 are shifted to short wavelengths and then disappear as the applied voltage increases.

That is, it can be seen from the test results of FIGS. 4B to 4E that when a failure occurs in a part of the light emitting units 50 of the light emitting area 90, the uniformity among the spectral characteristics of the plural light emitting units 50 is lost. When such a phenomenon occurs, for example, there is a risk that a deterioration in transmission quality may occur in an optical transmission device which will be described later. From this point, the number of light emitting units that are simultaneously damaged may be reduced even if a surge is applied, and a measure may be taken for the light emitting unit depending on the position thereof in the light emitting area.

Next, a method of manufacturing the light emitting element array 10 according to the present exemplary embodiment will be described with reference to FIGS. 5A to 5F. The light emitting element array 10 includes four light emitting units 50 as illustrated in FIG. 1B, and the light emitting units 50 are manufactured by the same manufacturing process, except for the formation of the shield portion 32. It should be noted that in FIGS. 5A to 5F, components having the same names but different reference numerals from those in FIGS. 1A and 1B have the same functions.

Figure 5A:
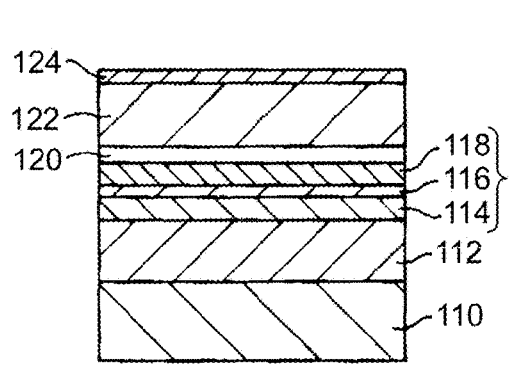
FIGS. 5A to 5F are cross-sectional views illustrating an example of a method of manufacturing the light emitting element array according to the first exemplary embodiment.

First, as illustrated in FIG. 5A, an n-type lower DBR 112, an active layer area 130, a p-type AlAs layer 120, a p-type upper DBR 122, and the contact layer 124 are sequentially stacked on a substrate 110 formed of n-type GaAs by the metal organic chemical vapor deposition (MOCVD) method. The n-type lower DBR 112 is formed by stacking 30 pairs of AlAs and GaAs so that each film thickness becomes one quarter of the intra-medium wavelength $\lambda'$ ($=\lambda/n$). The n-type lower DBR 112 has a carrier concentration of $1 \times 10^{18}$ cm$^{-3}$. The active layer area 130 includes the lower spacer 114 formed of undoped $Al_{0.22}Ga_{0.78}As$, the undoped quantum well active Layer 116 (configured with three InGaAs quantum well layers having a film thickness of 80 nm and four GaAs barrier layers having a film thickness of 150 nm), and the upper spacer 118 formed of undoped $Al_{0.22}Ga_{0.78}As$. A film thickness of the active layer area 130 is the intra-medium wavelength $\lambda'$. The p-type AlAs layer 120 has a carrier concentration of $1 \times 10^{18}$ cm$^{-3}$ and a film thickness of one quarter of the intra-medium wavelength $\lambda'$. The p-type upper DBR 122 is formed by stacking 22 pairs of $Al_{0.9}Ga_{0.1}As$ and GaAs so that each film thickness becomes one quarter of the intra-medium wavelength $\lambda'$. The p-type upper DBR 122 has a carrier concentration of $1 \times 10^{18}$ cm$^{-3}$. A total film thickness of the p-type upper DBR 122 is about 2 μm. The contact layer 124, is formed of p-type GaAs, has a carrier concentration of $1 \times 10^{19}$ cm$^{-3}$ and a film thickness of the intra-medium wavelength $\lambda'$.

The film formation is successively performed by using trimethylgallium, trimethylaluminum, trimethylindium, and arsine as a raw gas, cyclopentadinium magnesium as a p-type dopant material, and silane as an n-type dopant material, setting the substrate temperature to 750° C. during the film growth, and sequentially changing the raw gases without breaking a vacuum.

Figure 5B:
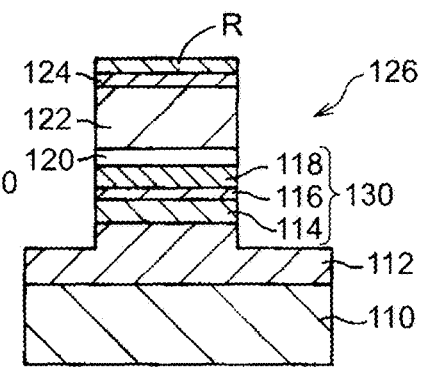

Next, as illustrated in FIG. 5B, the stacked films are etched to an intermediate portion of the lower DBR 112 to form a mesa 126, and the side surface of the AlAs layer 120 is exposed. In order to process the mesa shape, a resist mask R is formed on a crystal growth layer by photolithography, and reactive ion etching using carbon tetrachloride as an etching gas is performed.

Figure 5C:
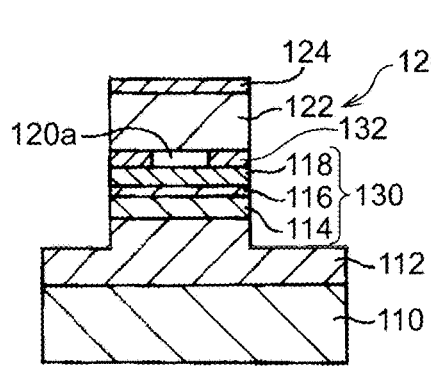

Thereafter, the resist mask R is removed. As illustrated in FIG. 5C, only the AlAs layer 120 is oxidized from the lateral side by water vapor in a furnace at about 400° C. so that the resistance thereof is increased. As a result, the AlAs layer 120 is formed into an oxidized area 132 and a non-oxidized area 120a. The diameter of the non-oxidized area 120a is, for example, about 3 µm. This non-oxidized area 120*a* serves as a current injection area.

Figure 5D:
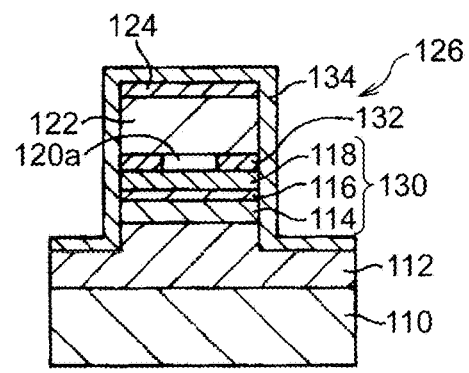
Figure 5E:
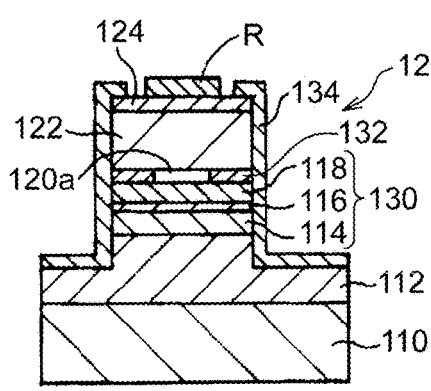
Figure 5F:
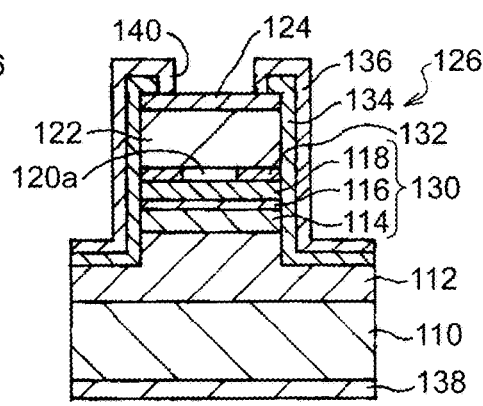

Thereafter, as illustrated in FIGS. 5D and 5E, an interlayer insulating film 134 formed of SiN is vapor-deposited thereon, except for the upper surface of the mesa 126. A p-side electrode wiring 136 formed of Ti/Au is formed thereon, except for an emission aperture 140, using the resist mask R. At this time, the shield portion 32 is formed on the mesa 126, which is to be formed into the shielded light emitting unit 50, using Ti/Au without forming the resist mask R. In addition, Au/Ge is deposited as the n-side electrode wiring 138 on the back surface of the substrate 110. In this way, the light emitting element array 10 illustrated in FIG. 5F is completed. The mode in which the current confinement structure is formed by oxidation is described by way of an example in the present exemplary embodiment. It should be noted that the exemplary embodiments are not limited thereto. For example, a current confinement structure may be formed by ion implantation.

<Arrangement of Light Emitting Units>

Next, the arrangement of the light emitting units 50 in the light emitting area 40 of the light emitting element array according to the present exemplary embodiment will be described with reference to FIGS. 6A to 6F. In addition to the arrangement of the light emitting units 50 illustrated in FIGS. 1A and 1B, various arrangements are applicable to the light emitting element array according to the present exemplary embodiment. In FIGS. 6A to 6F, the shielded light emitting units are indicated as shielded light emitting units 50B, and an non-shielded light emitting units are indicated as the light emitting units 50.

Figure 6A:
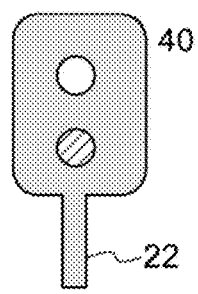
FIGS. 6A to 6F are plan views each illustrating an example of the arrangement of light emitting units in a light emitting area according to a modification of the first exemplary embodiment.
Figure 6B:
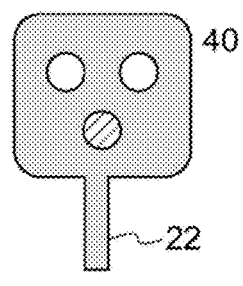
Figure 6C:
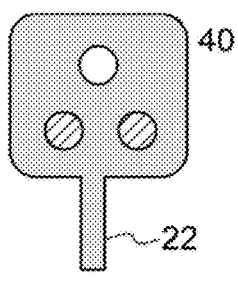
Figure 6D:
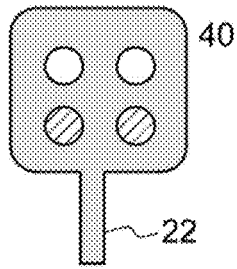
Figure 6E:
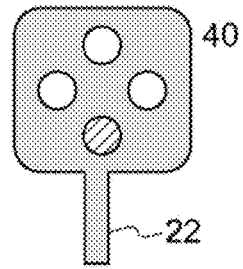
Figure 6F:
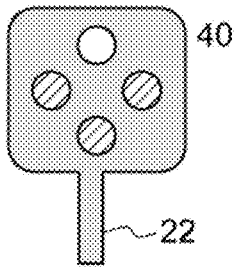

Arrangement 1: As illustrated in FIGS. 6B, 6D and 6E, multiple light emitting units 50 are provided.

With this arrangement, the amount of light emitted from one light emitting unit is reduced when the required optical output P is constant, compared to a case where only one light emitting unit 50 is provided. Therefore, the service life of each of the light emitting units 50 over time is increased.

Arrangement 2: As illustrated in FIGS. 6B, 6C, 6D and 6F, each of the shielded light emitting units 50B is disposed at a position other than the position of the longest path length.

With this arrangement, since light is emitted only from the light emitting units 50, each of which is the least affected by ESD, variation in wavelength spectrum is further reduced.

Arrangement 3: As illustrated in FIGS. 6C and 6D, multiple shielded light emitting units 50B are disposed at the positions of the shortest path length.

With this arrangement, all of the light emitting units that are the most affected by ESD are shielded. Therefore, variation in wavelength spectrum is further reduced, compared to a case where none of the light emitting units is shielded.

Arrangement 4: As illustrated in FIGS. 6B and 6D, multiple light emitting units 50 are disposed at the positions of the longest path length.

With this arrangement, the amount of light emitted from one light emitting unit 50 is reduced while reducing variation in wavelength spectrum by causing the multiple light emitting units 50 that are the least affected by ESD. Therefore, the service life over time is increased.

Arrangement 5: The shielded light emitting unit 50B is shifted to a position that is closer to the p-side electrode pad (terminal) than the light emitting unit 50 on the wiring.

With this arrangement, the influence of heat (thermal interference) of the shielded light emitting unit 50B on the light emitting unit 50 is reduced.

Second Exemplary Embodiment

An optical transmission device 200 according to the present exemplary embodiment will be described with reference to FIGS. 7A and 7B and FIGS. 8A and 8B. An optical transmission device 200 is a device that constitutes an optical transmitter of a communication apparatus which performs mutual optical communication via an optical fiber. The optical transmission device 200 is equipped with the light emitting element array 10 according to the above-described exemplary embodiment.

Figure 7A:
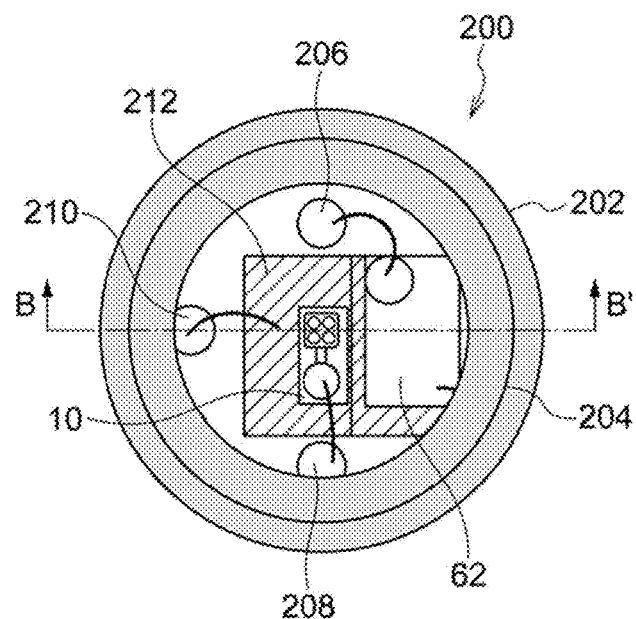
FIG. 7A is a plan view illustrating an example of the configuration of an optical transmission device according to a second exemplary embodiment.
Figure 7B:
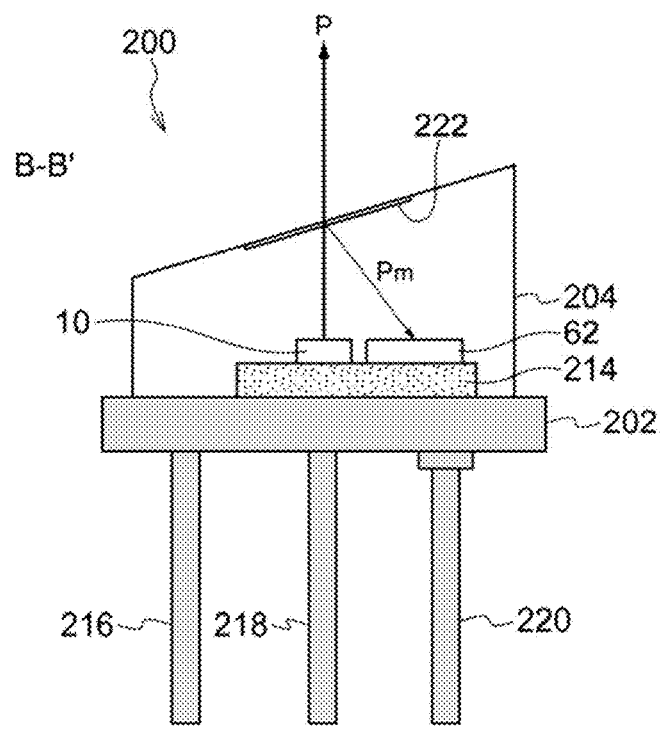
FIG. 7B is a cross-sectional view of the optical transmission device.

FIG. 7A is a plan view of the optical transmission device 200, and FIG. 7B is a cross-sectional view taken along the line B-B' illustrated in FIG. 7A. As illustrated in FIGS. 7A and 7B, the optical transmission device 200 includes a light emitting element array 10, a monitor photo diode (PD) 62, a sub-mount 214, and a package on which these components are mounted. The package of the optical transmission device 200 includes a stem 202, a cap 204, a cathode terminal 216, anode terminals 218 and 219 (in FIG. 7B, the anode terminal 219 is invisible because it is hidden behind the anode terminal 218), and a cathode terminal 220.

The sub-mount 214 is a substrate on which the light emitting element array 10, the monitor PD 62, and the like are mounted. The sub-mount 214 is configured with, for example, a semiconductor substrate. In addition to the light emitting element array 10 and the monitor PD 62, semiconductor elements which constitute a drive unit of the light emitting element array 10 and the like and required passive components such as a resistor and a capacitor may be mounted on the sub-mount 214. In addition, an n-side wiring 212 made of a metal film or the like is formed on the surface side of the sub-mount 214 on which the light emitting element array 10 and the like are mounted. The n-side electrode wiring 30 of the light emitting element array 10 is connected to the n-side wiring 212.

The stem 202 is a metal base on which the sub-mount 214 is mounted. The stem 202 holds the cathode terminal 216, the anode terminals 218 and 219, and the cathode terminal 220. The cathode terminal 216 and the anode terminals 218 and 219 are held on the stem via a required insulator. The cathode terminal 220 is directly brazed to (has the same potential as) the stem 202.

As illustrated in FIG. 7A, the p-side electrode pad 28 of the light emitting element array 10 is connected to an anode electrode 208 by a bonding wire and is connected to the outside (for example, a drive power supply) via an anode terminal 218. Meanwhile, the n-side electrode wiring 30 of the light emitting element array 10 is connected to a cathode electrode 210 via the n-side wiring 212 and a bonding wiring, and is connected to the outside (for example, the drive power supply) via the cathode terminal 216.

The monitor PD 62 is a monitor for monitoring the amount of light of the optical output P from the light emitting unit 50 of the light emitting element array 10 when the light emitting element array 10 is driven and controlled. That is, for example, when the light emitting element array 10 is driven and controlled by automatic power control (APC), a monitor current Im corresponding to the optical output P is generated and is supplied to an APC control circuit. Of course, the driving control method of the light emitting element array 10 is not limited to the APC method. The driving control method of the light emitting element array 10 may be a constant-current driving method, a constant-voltage driving method, or the like.

The anode of the monitor PD 62 is connected to an anode electrode 206 via a bonding wire, and is connected to the outside (for example, the drive power supply) via the anode terminal 219. Meanwhile, the cathode of the monitor PD 62 is connected to the stem 202 by a bonding wire and is connected to the outside (for example, the drive power supply) via the cathode terminal 220.

The cap 204 seals a semiconductor element or the like mounted on the sub-mount 214 in an airtight manner. The cap 204 of the present exemplary embodiment is formed of a metal. A cap 204 is formed with an opening so as to allow the optical output P from the light emitting element array 10 to pass therethrough. A partial reflection mirror 222 is attached to the opening. Most of the optical output P passes through the partial reflection mirror 222 and is output to the outside (an optical fiber which will be described later in the present exemplary embodiment). However, a part of the light (about 10% as an example) is reflected by the partial reflection mirror 222 and is incident on the monitor PD 62 as monitor light Pm. The monitor light Pm generates the above-described monitor current Im.

Figure 8A:
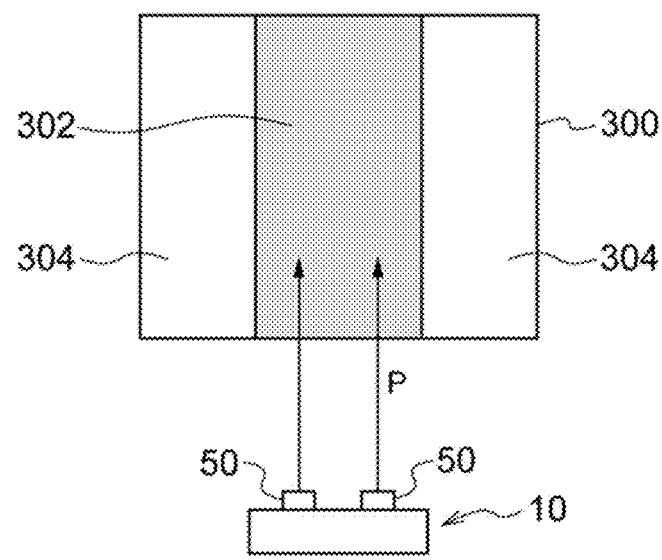
FIG. 8A is a side view illustrating a coupled state of a light emitting element array and an optical fiber in the optical transmission device according to the second exemplary embodiment.
Figure 8B:
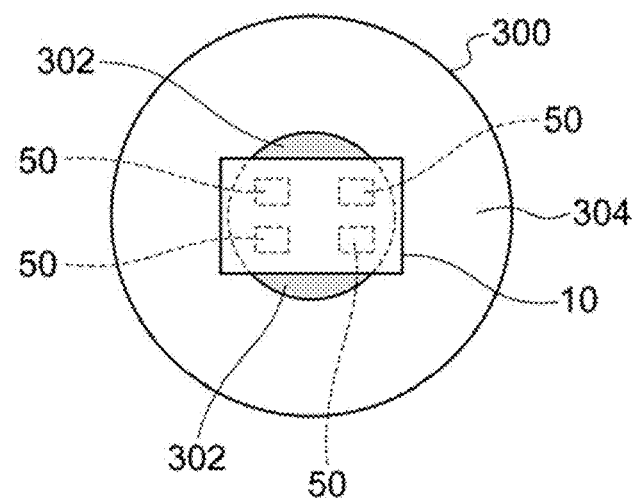
FIG. 8B is a plan view illustrating the coupled state.

Next, the coupling between the light emitting element array 10 and an optical fiber 300 will be described with reference to FIGS. 8A and 8B. FIG. 8A is a cross-sectional view illustrating the coupled state of the light emitting element array 10 and the optical fiber 300. FIG. 8B is a plan view illustrating the coupled state. As the optical fiber 300 according to the present exemplary embodiment, for example, a single mode fiber, a multi-mode fiber, or a plastic fiber may be used without particular limitation thereto. In the present exemplary embodiment, a multi-mode fiber which has a core diameter of 100 μm or less (50 μm or 62.5 μm) or about 100 μm or less is used.

As illustrated in FIG. 8A, the optical fiber 300 includes a core 302 and a clad 304. As illustrated in FIGS. 8A and 8B, the light emitting unit 50 of the light emitting element array 10 is disposed such that the optical output P enters the core 302 of the optical fiber 300. In the present exemplary embodiment, no lens is used for the coupling between the light emitting element array 10 and the optical fiber 300. It should be noted that the disclosure is not limited thereto. The light emitting element array 10 and the optical fiber 300 may be coupled to each other using a lens.

Here, the following arrangement may be applicable as the arrangement of the light emitting units 50 in the light emitting element array 10 mounted in the optical transmission device 200. This arrangement is given by way of example as one arrangement according to the above exemplary embodiment.

Arrangement 6: The light emitting unit(s) 50 are disposed at positions that are closer to the center of the core 302 than the shielded light emitting unit(s) 50B.

With this arrangement, the influence of heat (thermal interference) of the shielded light emitting unit(s) 50B on the light emitting unit(s) 50 is reduced.

The optical transmission device 200, which is mounted on the can-shaped package, has been described in the above-described exemplary embodiment by way of example. It should be noted that the present disclosure is not limited thereto. An optical transmission device may be mounted on a flat package.

Third Exemplary Embodiment

Hereinafter, an optical transmission device according to the present exemplary embodiment will be described. In the light emitting element array 10 and the optical transmission device 200 according to the above exemplary embodiments, in order to prevent deterioration in the uniformity of spectra of the optical output P from the light emitting element array 10, at least one emission aperture of the shortest light emitting unit 50S is shielded and at least one emission aperture of the longest light emitting unit SOL is not shielded so that no light is emitted from the shortest light emitting unit 50S. In the present exemplary embodiment, instead of shielding the shortest light emitting unit 50S, the shortest light emitting unit 50S is arranged so that the light emitted from the shortest light emitting unit 50S is not coupled to the optical fiber. An optical transmission device 200a according to the present exemplary embodiment is identical to the optical transmission device 200, except for the arrangement of the shortest light emitting unit 50S. Therefore, description of the optical transmission device 200a according to the present exemplary embodiment will refer to FIGS. 7A and 7B and FIGS. 8A and 8B if necessary, and illustration of the optical transmission device 200a will be omitted.

In the present exemplary embodiment, the shortest light emitting unit 50S is disposed as follows. That is, the longest light emitting unit 50L is disposed such that the light emitted from the longest light emitting unit 50L enters the optical fiber 300 and the shortest light emitting unit 50S is disposed such that the optical axis of the light emitted from the shortest light emitting unit 50S deviates from the optical axis of the optical fiber 300. The expression "the shortest light emitting unit 50S is disposed such that the optical axis of the light emitted therefrom deviates from the optical axis of the optical fiber 300" means that for example, in FIG. 8A, the position of the light emitting unit 50 is shifted in a plane that is parallel to a plane perpendicular to the core so as to prevent the optical output P emitted from the light emitting unit 50 from entering the core 302. In addition, it may be determined whether to shift the optical axis of the light emitting units other than the shortest light emitting unit 50S and the longest light emitting unit 50L, based on, for example, the optical output power required in the optical transmission apparatus 200a or the like.

As described above, deterioration in the uniformity of the wavelength spectrum is reduced by the optical transmission device according to the present exemplary embodiment.

In addition, the light emitting element array in which light emitting units are monolithically formed has been described in the respective exemplary embodiments. It should be noted that the disclosure is not limited thereto. Individual (discrete) light emitting elements as respective light emitting units may be used.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An optical transmission device comprising:
  a light emitting element array comprising a plurality of light emitting elements connected in parallel to each other by a wiring connected to a terminal that supplies a current, each of the light emitting elements being disposed at a position of a predetermined path length along a path of the current flowing from the terminal through the wiring, the plurality of light emitting elements including, in a mixed form, one or more first light emitting elements and one or more second light emitting elements, wherein at least one of the first light emitting elements is disposed at a position of the longest path length of the path and configured to emit light to a medium, wherein at least one of the second light emitting elements is disposed at a position of the shortest path length of the path and is configured to prevent light emitted by said at least one of the second light emitting elements from entering the medium, wherein the plurality of light emitting elements are vertical cavity surface emitting laser (VCSEL) elements, wherein the one or more first light emitting elements each has a non-shielded light emission aperture and the one or more second light emitting elements each has a shielded light emission aperture, wherein the medium is an optical transmission path configured to transmit light, and the light emitting element array is disposed such that light emitted from the light emitting element array enters the optical transmission path, wherein the optical transmission path includes a core configured to propagate the light, and wherein the one or more first light emitting elements are disposed at positions that are closer to a center of the core than the one or more second light emitting elements.

2. The optical transmission device according to claim 1, wherein
wherein the plurality of light emitting elements includes three or more light emitting elements, and
wherein the one or more first light emitting elements include a plurality of the first light emitting elements.

3. The optical transmission device according to claim 1, wherein
wherein the plurality of light emitting elements includes three or more light emitting elements, and
wherein the one or more second light emitting elements are disposed at positions other than the position of the longest path length.

4. The optical transmission device according to claim 1, wherein a plurality of the second light emitting elements are disposed at the positions of the shortest path length.

5. The optical transmission device according to claim 1, wherein a plurality of the first light emitting elements are disposed at the positions of the longest path length.

6. The optical transmission device according to claim 1, wherein all of the one or more second light emitting elements are disposed at positions that are closer to the terminal than all of the one or more first light emitting elements on the wiring.

7. The optical transmission device according to claim 1, wherein the first light emitting element is disposed such that the light emitted from the first light emitting element enters the optical transmission path, and
wherein the second light emitting element is disposed such that an optical axis of the light emitted from the second light emitting element deviates from an optical axis of the optical transmission path.

8. An optical transmission device comprising:
a light emitting element array comprising a plurality of light emitting elements connected in parallel to each other by a wiring connected to a terminal that supplies a current, each of the light emitting elements being disposed at a position of a predetermined path length along a path of the current flowing from the terminal through the wiring, the plurality of light emitting elements including, in a mixed form, one or more first light emitting elements and one or more second light emitting elements, wherein at least one of the first light emitting elements is disposed at a position of the longest path length of the path and configured to emit light to a medium, and wherein at least one of the second light emitting elements is disposed at a position of the shortest path length of the path and is configured to prevent light emitted by said at least one of the second light emitting elements from entering the medium, wherein the plurality of light emitting elements are vertical cavity surface emitting laser (VCSEL) elements, wherein the one or more first light emitting elements each has a non-shielded light emission aperture and the one or more second light emitting elements each has a shielded light emission aperture, wherein the medium is an optical transmission path configured to transmit light, and the light emitting element array is disposed such that light emitted from the light emitting element array enters the optical transmission path, and wherein the optical transmission path is a multi-mode fiber having a core diameter of about 100 μm or less.

9. The optical transmission device according to claim 1, wherein the optical transmission path is a multi-mode fiber having a core diameter of about 100 μm or less.

10. The optical transmission device according to claim 7, wherein the optical transmission path is a multi-mode fiber having a core diameter of about 100 μm or less.

* * * * *